United States Patent
Van Ingen Schenau et al.

(10) Patent No.: US 9,052,605 B2
(45) Date of Patent: Jun. 9, 2015

(54) ILLUMINATION SYSTEM FOR LITHOGRAPHIC APPARATUS WITH CONTROL SYSTEM TO EFFECT AN ADJUSTMENT OF AN IMAGING PARAMETER

(75) Inventors: Koen Van Ingen Schenau, Veldhoven (NL); Jan Bernard Plechelmus Van Schoot, Eindhoven (NL); Gosse Charles De Vries, Veldhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 403 days.

(21) Appl. No.: 13/517,480

(22) PCT Filed: Nov. 19, 2010

(86) PCT No.: PCT/EP2010/067834
§ 371 (c)(1),
(2), (4) Date: Jun. 20, 2012

(87) PCT Pub. No.: WO2011/076500
PCT Pub. Date: Jun. 30, 2011

(65) Prior Publication Data
US 2012/0262689 A1   Oct. 18, 2012

Related U.S. Application Data

(60) Provisional application No. 61/289,736, filed on Dec. 23, 2009.

(51) Int. Cl.
*G03F 7/20* (2006.01)

(52) U.S. Cl.
CPC ........ *G03F 7/70116* (2013.01); *G03F 7/70075* (2013.01)

(58) Field of Classification Search
CPC ............ G02B 26/0833; G02B 27/0068; G03F 7/70075; G03F 7/70116; G03F 7/70191; G03F 7/70425
USPC ........................ 355/67; 359/196.1, 216.1, 850
See application file for complete search history.

(56) References Cited

U.S. PATENT DOCUMENTS

| 6,737,662 B2 | 5/2004 | Mulder et al. |
| 7,196,841 B2 | 3/2007 | Melzer et al. |

(Continued)

FOREIGN PATENT DOCUMENTS

| CN | 1985356 | 6/2007 |
| EP | 1262836 | 12/2002 |

(Continued)

OTHER PUBLICATIONS

International Search Report for PCT International Patent Application No. PCT/EP2010/067834, mailed Apr. 7, 2011.

(Continued)

*Primary Examiner* — Peter B Kim
*Assistant Examiner* — Michelle Iacoletti
(74) *Attorney, Agent, or Firm* — Pillsbury Winthrop Shaw Pittman LLP

(57) ABSTRACT

In a lithographic apparatus, an illumination mode is set using a field mirror that includes a plurality of movable facets to direct radiation to selectable positions on a pupil facet mirror. A base illumination mode is selected from a set of predetermined illumination modes and the movable facets are set to effect that mode. In order to adjust an imaging parameter, a fraction of the movable facets are set to different positions. The determination of which facets to set to different positions is based on summing the effects of setting each facet to a different position.

25 Claims, 8 Drawing Sheets

(56) References Cited

U.S. PATENT DOCUMENTS

| | | | |
|---|---|---|---|
| 7,800,734 | B2 | 9/2010 | Komatsuda |
| 8,144,308 | B2 | 3/2012 | Muramatsu |
| 2004/0108467 | A1 | 6/2004 | Eurlings et al. |
| 2005/0231651 | A1* | 10/2005 | Myers et al. ............ 348/744 |
| 2006/0050261 | A1 | 3/2006 | Brotsack |
| 2006/0170617 | A1* | 8/2006 | Latypov et al. ............ 345/32 |
| 2007/0030471 | A1* | 2/2007 | Troost et al. ............ 355/67 |
| 2007/0209029 | A1* | 9/2007 | Ivonin et al. ............ 716/19 |
| 2008/0013066 | A1 | 1/2008 | Brotsack |
| 2008/0158529 | A1 | 7/2008 | Hansen |
| 2008/0165925 | A1* | 7/2008 | Singer et al. ............ 378/34 |
| 2008/0309902 | A1 | 12/2008 | Rosenbluth |
| 2009/0033902 | A1* | 2/2009 | Mulder et al. ............ 355/66 |
| 2012/0293784 | A1* | 11/2012 | Xalter et al. ............ 355/67 |

FOREIGN PATENT DOCUMENTS

| | | |
|---|---|---|
| JP | 2003-22967 | 1/2003 |
| JP | 2005-167253 | 6/2005 |
| JP | 2005-524236 | 8/2005 |
| JP | 2008-166777 | 7/2008 |
| JP | 2009-117671 | 5/2009 |

OTHER PUBLICATIONS

Melchior Mulder et al., "Performance of a Programmable Illuminator for generation of Freeform Sources on high NA immersion systems," Proc. of SPIE, vol. 7520, No. 75200Y, pp. 75200Y-1-75200Y-9 (Dec. 11, 2009).

* cited by examiner

# ILLUMINATION SYSTEM FOR LITHOGRAPHIC APPARATUS WITH CONTROL SYSTEM TO EFFECT AN ADJUSTMENT OF AN IMAGING PARAMETER

CROSS-REFERENCE TO RELATED APPLICATIONS

This application is the United States national phase entry of PCT/EP2010/067834, filed Nov. 19, 2010, which claims the benefit of priority from U.S. provisional application No. 61/289,736 which was filed on 23 Dec. 2009, the contents of both of which are incorporated herein in their entireties by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured. A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of k1.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

It is well known in the art of lithography that an image of the patterning device projected onto a substrate can be improved by appropriately choosing angles at which the patterning device is illuminated, i.e., by appropriately choosing an angular distribution of radiation illuminating the patterning device. In a lithographic apparatus having a Koehler illumination system, the angular distribution of radiation illuminating the patterning device is determined by a spatial intensity distribution of the illumination beam in a pupil plane of the illumination system. This is because the illumination beam at the pupil plane effectively acts as a secondary or virtual radiation source for producing the illumination beam that is incident on the patterning device. The shape of the spatial intensity distribution of the illumination beam at the pupil plane within the illumination system is commonly referred to as the illumination mode or profile.

Illumination beams with certain spatial intensity distributions at the pupil plane improve the processing latitudes when an image of the patterning device is projected onto a substrate. In theory, for a given pattern to be imaged, an optimum illumination mode can be calculated. However, this is rarely done because the calculation is difficult and it may not in any event be possible or economic to achieve the desired intensity distribution in the pupil plane. Therefore in many cases one of a set of predetermined, standard illumination modes, e.g. dipole, annular or quadrupole off-axis illumination modes is selected according to the characteristics of the pattern to be imaged. Some parameters of these modes may be adjusted, for example the size and distance for the optical axis of the poles or the inner and outer radii ($\sigma_{inner}$ and $\sigma_{outer}$) of an annular illumination mode. The mode selected can enhance the resolution and/or other parameters of the projection, such as sensitivity to projection system optical aberrations, exposure latitude and depth of focus.

The parameters of the illumination mode can be used to adjust imaging parameters such as CD vs pitch and NILS (Normalized Image Log Slope, a measure of contrast) vs pitch. These parameters can also be affected by Optical Proximity Corrections (non-imaging features and/or adjustments of feature dimensions in the mask pattern) and by introducing a small amount of defocus, e.g. by tilting the substrate. A combination of all three possible adjustments—parameters of the illumination mode, OPC and defocus—can be used to optimize imaging as far as possible.

In lithographic apparatus using EUV as the projection beam, transmissive optical elements, such as a zoom-axicon and diffractive optical elements cannot be used to shape the illumination beam because there are no suitable materials transmissive to EUV. A known illumination system for EUV radiation comprises a field mirror which collects radiation from the source and directs it to a pupil mirror, which is associated with a pupil plane of the patterning device. It has been proposed, see for example U.S. Provisional Patent Application Nos. 61/157,498, filed Mar. 4, 2009 and 61/236, 789, filed Aug. 25, 2009, each of which is hereby incorporated by reference in its entirety, to form the field mirror from an arrangement of individually movable facets which direct radiation onto corresponding facets of the pupil mirror in order to define a desired illumination mode. In one arrangement, each movable field facet can be switched between two positions to direct radiation onto a selected one of two corresponding pupil facets. In another arrangement, each movable field facet can be switched between three positions to direct radiation onto a selected one of two corresponding pupil facets or in a direction such that it does not reach the substrate.

SUMMARY

In an illumination system using a field facet mirror with movable field facets, the location of the pupil facets to which light is directed in their different positions (known as channel assignments) determines the illumination modes that can be achieved. Even with a large number of movable facets, e.g. 300 or more, each of which can take a limited number of positions, only a limited number of illumination modes can be achieved and the parameters of such modes cannot be finely adjusted. Because of illumination uniformity requirements, the field facets are grouped together and switched in those groups to effect a number of standard illumination modes, such as dipole, quadrupole and annular, with fixed parameters. It is also not possible in an EUV lithography apparatus with a curved slit to introduce defocus to control imaging by tilting the substrate.

It is desirable to provide a lithographic apparatus having a field facet mirror including movable facets that is able to make small adjustments to the illumination mode.

According to an aspect of the invention, there is provided an illumination system for a lithographic apparatus arranged to project a pattern from a patterning device onto a substrate, the illumination system is configured to condition a radiation beam and direct the radiation beam onto the patterning device, the illumination system comprising: a first reflective component and a second reflective component, the first reflective component being arranged to direct radiation of the radiation beam onto the second reflective component and comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions in order to effect a desired illumination mode selected from a set of predetermined illumination modes and further arranged to set at least one of the moveable reflective elements to a corrective position, different than its desired position, to effect an adjustment of an imaging parameter.

According to an aspect of the invention, there is provided lithographic method for manufacturing a device, the method comprising: directing a radiation beam onto a first reflective component so that it is reflected thereby and incident on a second reflective component, the radiation beam being incident thereafter on a patterning device, and first reflective component comprising a plurality of movable reflective elements, each movable reflective element being moveable between at least a first position and a second position so as to change an illumination mode of the patterning device; patterning the radiation beam using the patterning device; and projecting the patterned radiation beam onto a substrate, the method further comprising: setting the movable reflective elements to desired positions to define a desired illumination mode selected from a set of predetermined illumination modes; and setting at least one of the moveable reflective elements to a corrective position, different than its desired position, to effect an adjustment of an imaging parameter.

According to an aspect of the invention, there is provided computer program product comprising a computer readable memory storing instructions for controlling a lithographic apparatus arranged to project a pattern from a patterning device onto a substrate and having an illumination system configured to condition a radiation beam and direct the radiation beam onto the patterning device; wherein the illumination system comprises: a first reflective component and a second reflective component, the first reflective component being arranged to direct radiation of the radiation beam onto the second reflective component and comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions, the instructions being effective to perform a method comprising: setting the movable reflective elements to desired positions to define a desired illumination mode selected from a set of predetermined illumination modes; and setting at least one of the moveable reflective elements to a corrective position, different than its desired position, to effect an adjustment of an imaging parameter.

According to an aspect of the invention, there is provided a method of matching a plurality of lithography apparatus to manufacture devices according to a recipe, each lithographic apparatus arranged to project a pattern from a patterning device onto a substrate and having an illumination system configured to condition a radiation beam and direct the radiation beam onto the patterning device; wherein the illumination system comprises: a first reflective component and a second reflective component, the first reflective component being arranged to direct radiation of the radiation beam onto the second reflective component and comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions, the method comprising: optimizing illumination settings on a first one of the lithographic apparatus by selecting a base illumination mode from a set of predetermined illumination modes and selecting at least one of the movable reflective elements of the first lithographic apparatus to set to a corrective position to effect an adjustment of an imaging parameter; determining illumination settings for a second one of the lithographic apparatus so that its imaging performance matches the first one of the lithographic apparatus by selecting at least one of the movable reflective elements of the second lithographic apparatus to set to a corrective position different than a position effective to contribute to the base illumination mode.

According to an aspect of the invention, there is provided a lithographic apparatus that includes an illumination system configured to condition a radiation beam. The illumination system includes a first reflective component and a second reflective component, the first reflective component being arranged to direct radiation of the radiation beam onto the second reflective component, the first reflective component comprising a plurality of movable reflective elements, each movable reflective element being moveable between at least a first position and a second position so as to change an illumination mode, and the second reflective component being associated with a pupil plane of the patterning device, and a control system arranged to set the plurality of moveable reflective elements to respective desired positions in order to effect a desired illumination mode selected from a set of predetermined illumination modes and further arranged to set at least one of the moveable reflective elements to a corrective position, different than its desired position, to effect an adjustment of an imaging parameter. The lithographic apparatus also includes a support configured to support a patterning device, the patterning device being configured to receive the conditioned radiation beam from the illumination system and pattern the conditioned radiation beam to form a patterned radiation beam, and a projection system configured to project the patterned radiation beam onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
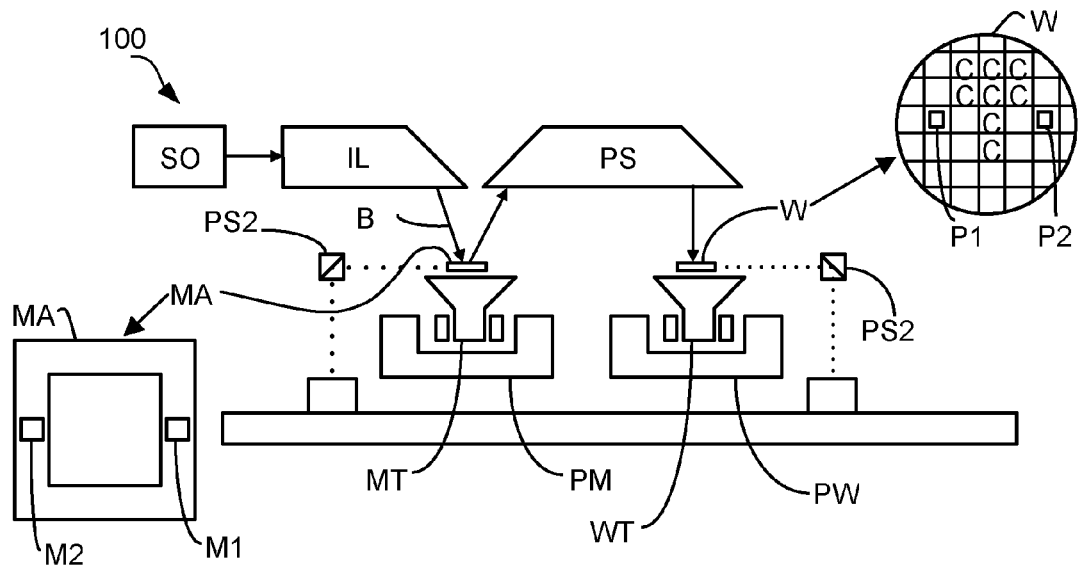
FIG. 1 depicts a lithographic apparatus according to an embodiment of the invention.

FIG. 1 schematically depicts a lithographic apparatus 100 including a source collector module SO according to one embodiment of the invention. The apparatus comprises: an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the minor matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing minors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Desirably, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-) magnification and image reversal characteristics of the projection system PS.
3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
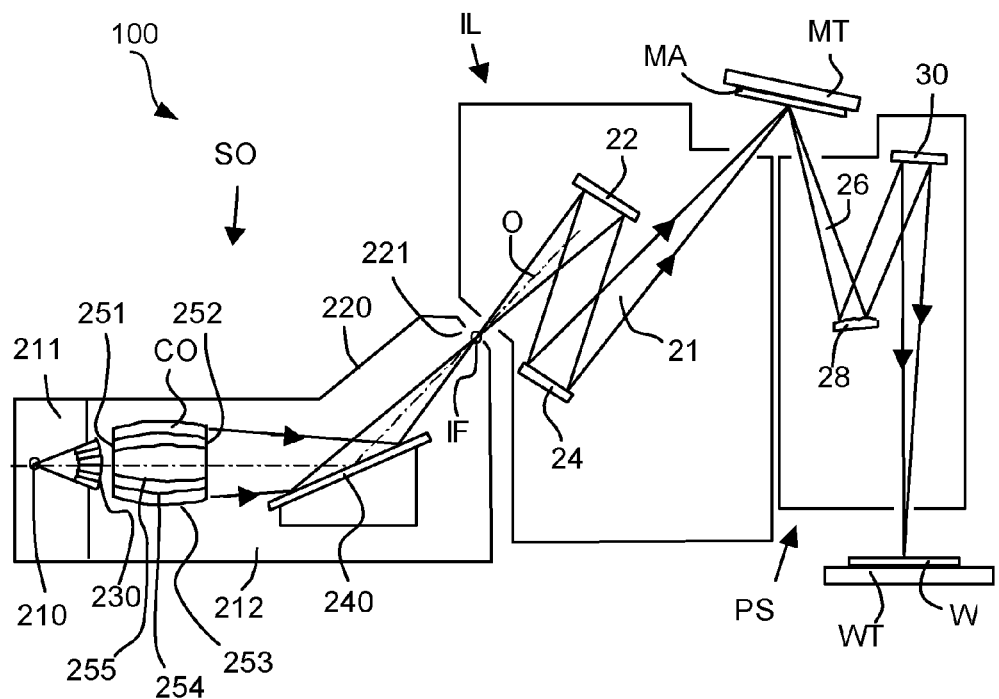
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
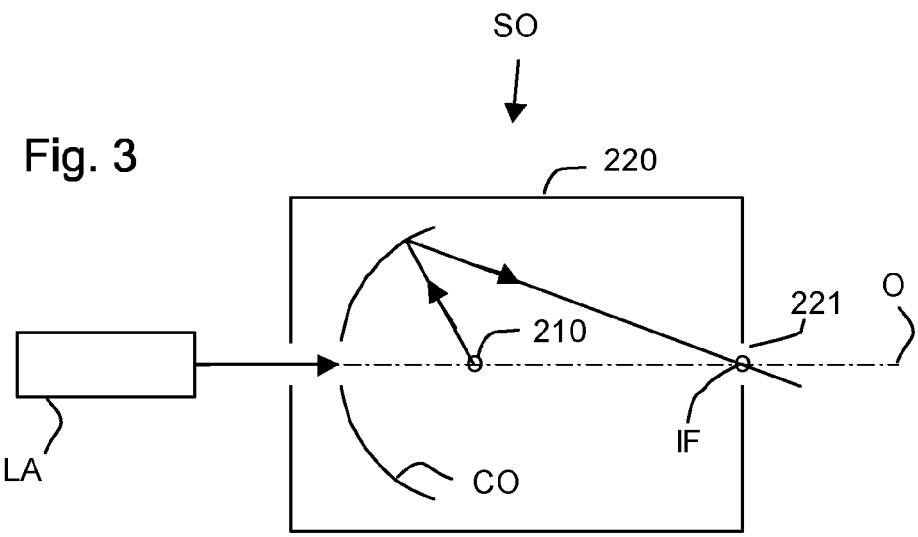
FIG. 3 is a more detailed view of a source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
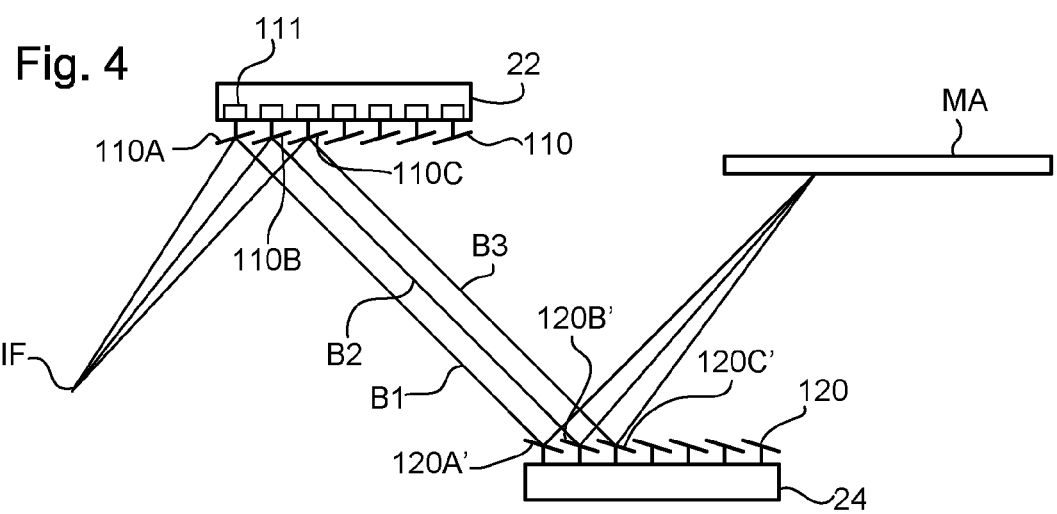
FIGS. 4 and 5 depict the illumination system of the apparatus of FIGS. 1 and 2 and illustrate the functioning of movable field facet mirrors.
Figure 5:
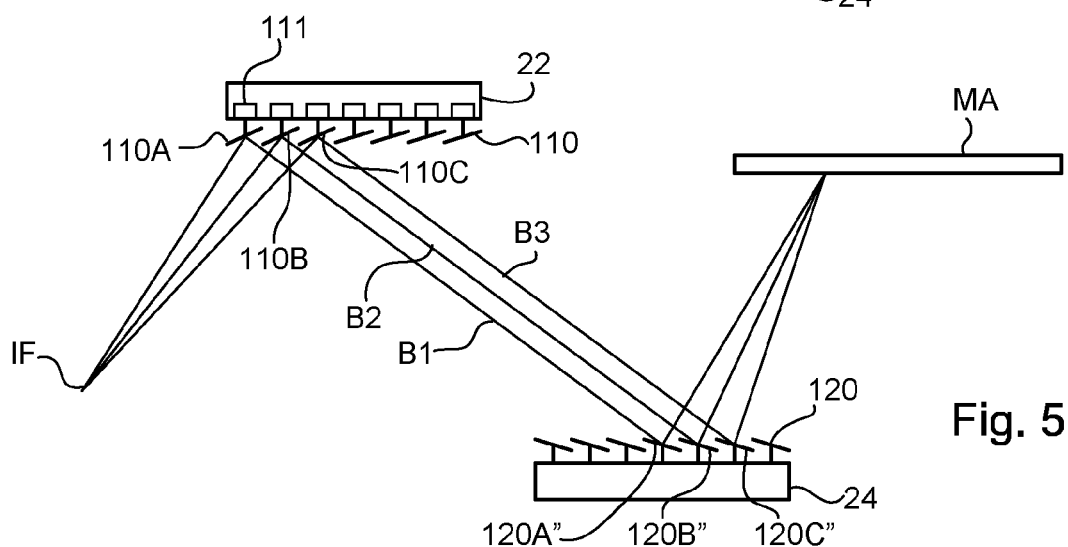

FIGS. 4 and 5 are schematic diagrams showing how the illumination beam is conditioned and directed to the mask using first reflective component 22 and second reflective component 24. Note that other optical components may be included in illuminator IL but are omitted from the following description for clarity.

In the embodiment, first reflective component 22 comprises a plurality of primary reflective elements commonly known as field facet mirrors 110. The second reflective component 24 comprises a plurality of secondary reflective elements commonly known as pupil facet mirrors 120. The primary reflective elements 110 are configured to direct (reflect) radiation towards the secondary reflective elements 120. The primary reflective elements of the first reflective component are configured side by side close enough together so as to leave substantially no gap in between in order to reduce or minimize any loss of radiation. The secondary reflective elements of the second reflective component are also configured so as to reduce or minimize any loss of radiation.

The second reflective component 24 is associated with the pupil plane and so the second reflective component acts as a virtual radiation source. In an embodiment, the second reflective component is located in and coincides with the pupil plane. In an embodiment, the second reflective component may be displaced a small distance from the pupil plane. The secondary reflective elements direct radiation to appropriately fill the illumination field on the patterning device MA. In an embodiment, there may be disposed, in the illuminator, a condenser mirror or system of mirrors (not shown), which images the field facet mirrors on the patterning device.

The angular distribution of radiation illuminating the mask is determined by the spatial intensity distribution of the radiation beam at the second reflective component. The spatial intensity distribution is determined by which of the secondary reflective elements are illuminated i.e. the illumination mode at the second reflective component. The illumination of the secondary reflective elements is in turn determined by the position of each of the primary reflective elements.

The illumination mode is controlled by selecting and then moving each of the primary reflective elements 110 to either its first position or a second position as required. When primary reflective elements 110A, 110B and 110C are orientated in their first positions, sub-beams of radiation are reflected towards associated first secondary reflective elements 120A', 120B' and 120C'—see FIG. 4. When primary reflective elements 110A, 110B and 110C are orientated in their second positions, sub-beams of radiation are reflected towards different second associated secondary reflective elements 120A", 120B" and 120C"—see FIG. 5.

It will be understood that secondary reflective elements 120A', 120B' and 120C' are essentially first associated locations at the second reflective component. Likewise, secondary reflective elements 120A", 120B" and 120C" are essentially second associated locations at the second reflective component.

The first position and second position of each primary reflective element are different and unique with respect to those of the other primary reflective elements. Likewise, the two secondary reflective elements associated with each primary reflective element are different and unique with respect to the secondary reflective elements associated with the other primary reflective elements. By selecting and moving each primary reflective element appropriately, radiation can be directed towards the requisite secondary reflective elements at the pupil plane so as to produce a particular desired spatial intensity distribution with a specific illumination mode. By controlling the position of each primary reflective element as required the spatial intensity distribution of the radiation beam at the pupil plane can be switched, that is changed, to other desired spatial intensity distributions having different illumination modes. For example, the sub-beams may be directed to certain locations at the pupil plane so as to produce spatial intensity distributions with, for example, an annular, a dipole, a quadrupole, etc. off-axis shaped illumination mode.

In an embodiment, the secondary reflective elements are permanently mounted such that the orientation of each of the secondary reflective elements is fixed and unchanging. To allow for the illumination of two different secondary reflective elements by each primary reflective element, the ratio of primary reflective elements to secondary reflective elements is at least 1:2. The primary reflective elements are configured to only direct radiation onto a single corresponding secondary reflective element at anyone time. Moreover, an optical power of a primary reflective element is selected and configured to produce a radiation beam with a suitable size and etendue ratio so as to ensure the radiation beam reflected by the primary reflective element is small enough to illuminate only a single corresponding secondary reflective element at anyone time.

Although FIGS. 4 and 5 show only a few primary reflective elements and associated secondary reflective elements, the illuminator may comprise a larger number of primary reflective elements and a larger number of secondary reflective elements.

An array of primary reflective elements may be arranged and/or an array of secondary reflective elements may be arranged in a two dimensional grid-like formation in a plane which crosses through the plane of the radiation beam. The first reflective component may comprise one or more arrays of primary reflective elements. Likewise, the second reflective component may comprise one or more corresponding arrays of secondary reflective elements. For example, a lithographic apparatus may comprise 16 arrays of primary reflective elements used in conjunction with 32 arrays of secondary reflective elements. As mentioned previously, the term "array" in this text may mean a single array or group of arrays.

As explained above, the lithographic apparatus may produce a desired illumination mode at the pupil plane in the illuminator by selecting the requisite position of and moving each primary reflective element to its requisite position accordingly. In an embodiment, the orientation of each primary reflective element is limited to only two positions—the first position and the second position—and are not in normal operation movable to any other position (e.g. a position between the first position and the second position). Such an embodiment is referred to below as a two-position field facet mirror.

In another embodiment, each primary reflective element is movable to a third position, which may, for example, be between the first and second positions. In the third position, the radiation reflected by the primary reflective element does not reach the substrate. The third position may be regarded as an "off" position. Such an embodiment is referred to below as a three-position field facet mirror. In a variant of the three-position field facet mirror, the third position directs radiation to a position in the pupil plane such that at least some radiation does reach the substrate. A three-position field facet mirror may have some facets for which the third position is an "off" position and some for which the third position is an "on" position. But different than the first and second positions.

In an embodiment, each primary reflective element is moved between positions by rotating it about an (predetermined) axis. The locations of the first associated location (e.g. first associated secondary reflective element) and second associated location (e.g. second associated secondary reflective element) at the pupil plane are dependent on the angles of rotation to the first position and second position (associated with the first and second locations).

In an embodiment, the first position and second position of each primary reflective element (and subsequently the first and second associated locations) are chosen so as to maximize the number of useful illumination modes that can be produced.

A primary reflective element can be rotated about an axis between a first position and a second position by a driver.

One or more primary reflective elements may be configured to be driven to rotate around the same axis. One or more other primary reflective elements may be configured to be driven to rotate around other axes.

In an embodiment, each primary reflective element comprises a driver motor 111 to drive the primary reflective element. The first and second positions may be defined by mechanical end stops, so that in a two position field facet mirror, a driver signal to be applied to the driver motor can be a binary signal. It is appreciated that such a use of binary (two-valued) driver signals for driver motors mitigates the complexity of a control system to provide feedback control of the orientation of each mirror. A more complex control system is required for a three position field facet mirror but such a mirror has the advantage of enabling additional illumination modes to be defined. For example the size of the poles in a multipole illumination mode can be controlled at the cost of reduced throughput.

Figure 6:
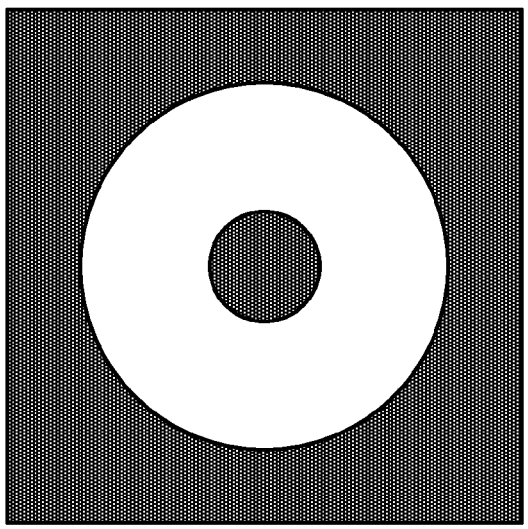
FIGS. 6 to 9 depict examples of different illumination modes used in an embodiment of the invention.

FIG. 6 shows an illumination mode generated by a field facet mirror. The illumination mode shown in FIG. 6 is an annular illumination mode. This is one of a plurality of base illumination modes that the field facet mirror is arranged to effect by appropriate selection of the directions in which the movable facet mirrors direct radiation in their different positions (channel assignment). Other base illumination modes may include dipole illumination, quadrupole illumination and conventional illumination. The set of base illumination modes that can be effected may include variations of these types, e.g. dipole or quadrupole illumination modes with different sized poles, or annular illumination with different modes $\sigma_{inner}$ or $\sigma_{outer}$ values. For a given pattern to be imaged, one of these base illumination modes is selected. Because the base illumination mode is selected from a limited set of such modes that can be created by the field facet mirror, it will likely not be ideal for imaging any given pattern. In a lithographic apparatus using DUV radiation, it is possible to adjust such a base illumination mode in small steps, e.g. through the use of a zoom-axicon or reticle masking blades or by tilting the substrate to introduce a controlled amount of defocus. However, such small adjustments are not possible in a lithographic apparatus using EUV radiation because the reflective illumination optics are not capable of fine adjustments and the image slit is generally curved.

The present inventors however have determined that fine adjustments to the illumination mode can be effected by individually switching a proportion of the field facets to different positions than are required to effect the base illumination mode. Where the field facet mirrors are arranged in groups that are switched together in order to effect the predetermined, base illumination modes, the present invention desirably switches individual mirrors within those groups. Switching some of the field facet mirrors to different positions will not result in a simple illumination mode desirably by such parameters as $\sigma_{inner}$ and $\sigma_{outer}$. It does not therefore provide a means of adjusting those parameters but can affect parameters measured at substrate level. This approach is, in particular, effective to adjust proximity effects, for example CD vs pitch, normalized image log slope (NILS) vs pitch and HV off-set vs pitch. Other imaging parameters that can be adjusted include global HV off-set. An embodiment of the invention is also useful for matching lithographic apparatus.

An embodiment of the present invention is particularly effective where the effects of individually switching different ones of the field facets to different positions on a given image parameter can be summed linearly. The inventors have determined that the ability to sum the effects of different facets linearly holds if up to 20%, preferably up to 10%, of the field facets are switched away from their base setting. This is discussed further below with reference to a specific example.

Figure 7:
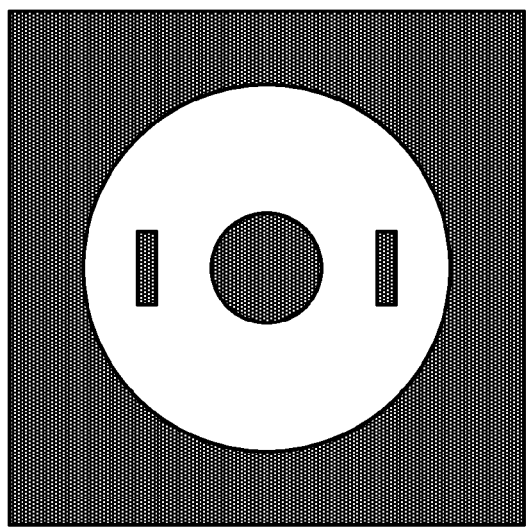
Figure 8:
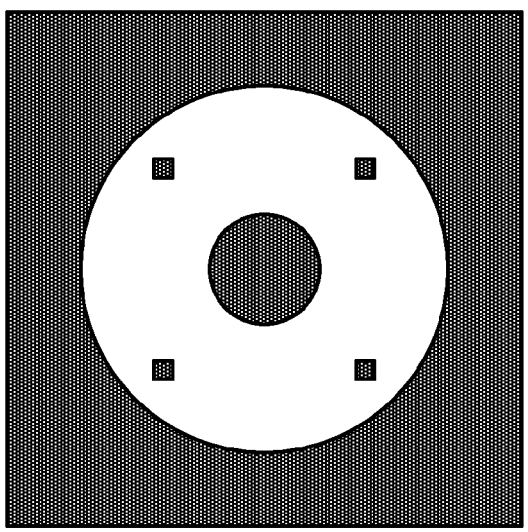
Figure 9:
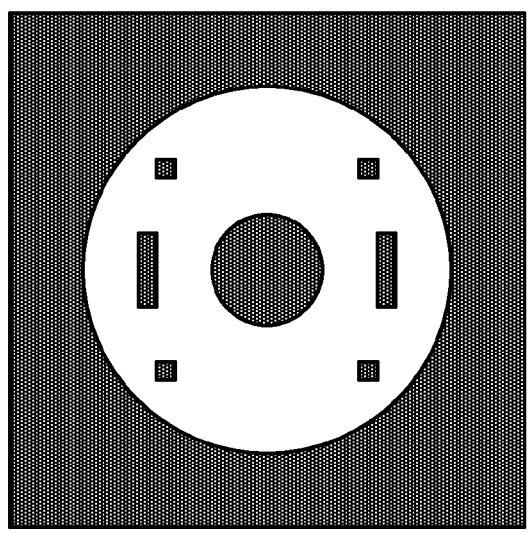

FIG. 7 shows approximately an illumination mode formed from the inside of FIG. 6 by switching 10 of the field facets set to "off" positions so as to create two dark, e.g. black, bars within the bright annulus of the annular illumination mode of FIG. 6. The dark bars are, in this example, situated on the X axis of the pupil plane and extend parallel to the Y axis. FIG. 8 shows approximately an illumination mode formed from the basic illumination mode of FIG. 6 by switching 16 field facets to "off" positions to create 4 dark squares within the bright annulus. In this example the 4 dark squares are located symmetrically about the X and Y axes, on lines at 45 degrees to those axes. FIG. 9 shows approximately a resulting illumination mode when both the 10 facets used to create the dark bars of FIG. 7 and the 16 facets used to create the dark squares of FIG. 8 are switched to the off positions. The illumination mode of FIG. 9 therefore includes both the dark bars and the dark squares.

Figure 10:
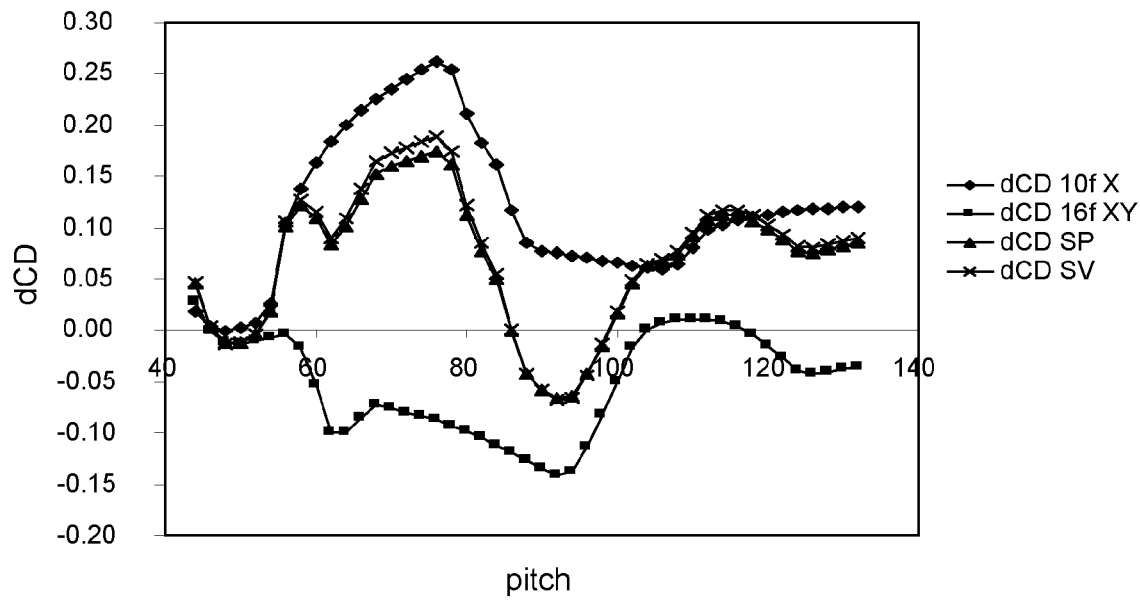
FIG. 10 is a graph of change in CD with pitch using the different illumination modes of FIGS. 7 to 9.
Figure 11:
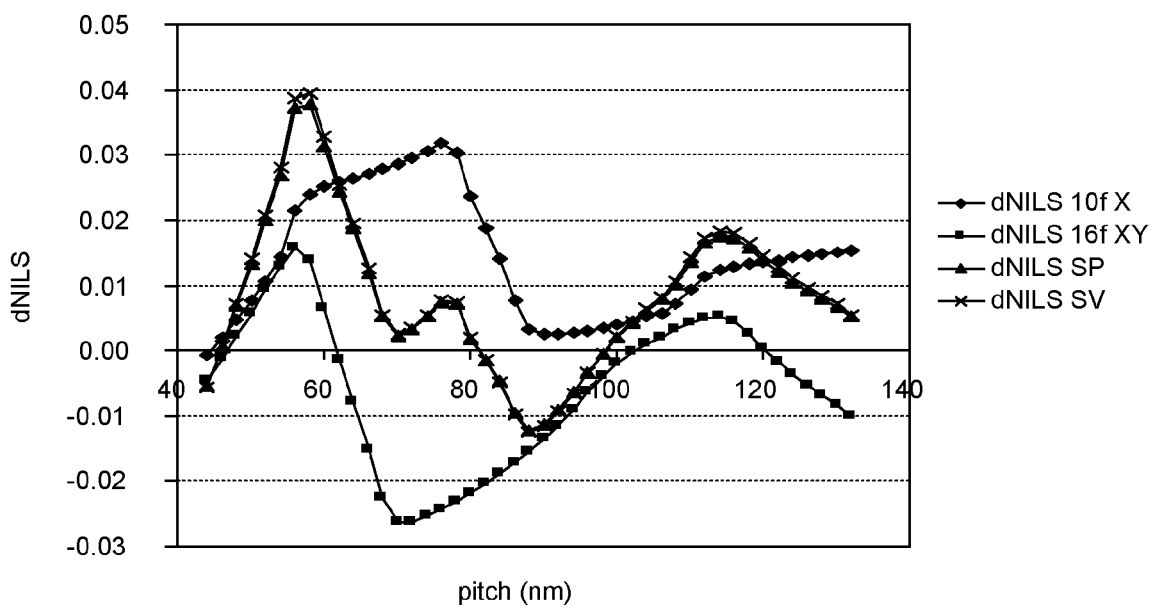
FIG. 11 is a graph of change in NILS with pitch using the different illumination modes of FIGS. 7 to 9.

The effect of these different illumination modes on CD is shown graphically in FIG. 10 which represents the results of simulation of a 22 nm node pattern in an apparatus with an NA of 0.3 and including 7 nm 1 s resist blur. The same conditions were used in further simulations discussed below. In FIG. 10, pitch in nm is shown along the X axis and the change in CD relative to the illumination mode of FIG. 6 on the Y axis. In FIG. 10, the effect on CD of the illumination mode of FIG. 7 is shown by the line joining black diamonds and labeled dCD 10/X. The effect of the illumination mode of FIG. 8 is shown by the line joining black squares and labeled "dCD 16/XY". The sum of these two curves is shown by the line joining black triangles and labeled "dCD SP". It will be seen that this is very close, effectively the same within the limits of experimental error, to the line linking crosses labeled "dCD SV", which is the simulated result obtained using the combined illumination mode of FIG. 9. FIG. 11 shows similar results for normalized image log slope. Plotted are lines for the change in normalized image log slope, compared to that achieved with the illumination mode of FIG. 6, for the illumination modes of FIG. 7 (diamonds) and FIG. 8 (squares) as well as the sum of those changes (triangles) and simulated results from the illumination mode of FIG. 9 (crosses). Again, it can be seen that the predicted and verified results agree almost exactly.

In this example, the field facet mirror used had more than 300 facets, all of which are switched "on" to produce the annular illumination mode of FIG. 6 so that the number of facets switched off in order to adjust the imaging parameter is less than about 10% of the total. It will be appreciated that there is a corresponding reduction in image intensity at substrate level and hence in throughput. However, such a loss of throughput is tolerable if the improvement in imaging resulting from the adjustments generates an improvement in yield.

Figure 12:
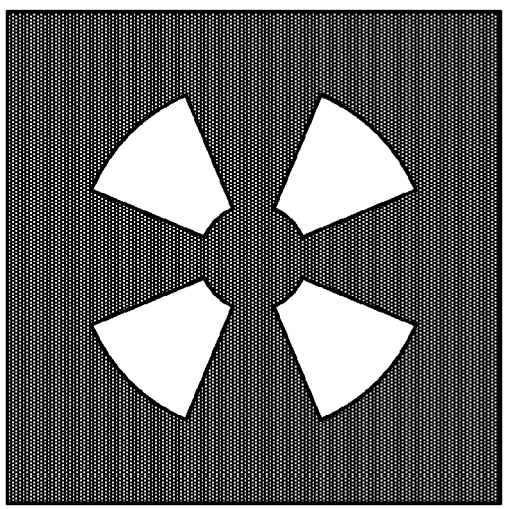
FIGS. 12 and 13 depict examples of different illumination modes in another embodiment of the invention.
Figure 13:
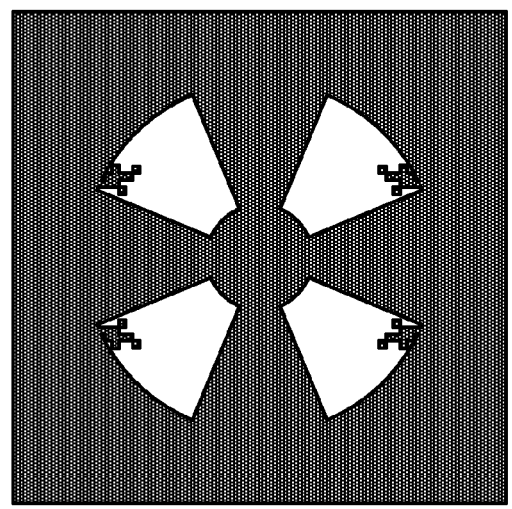
Figure 14:
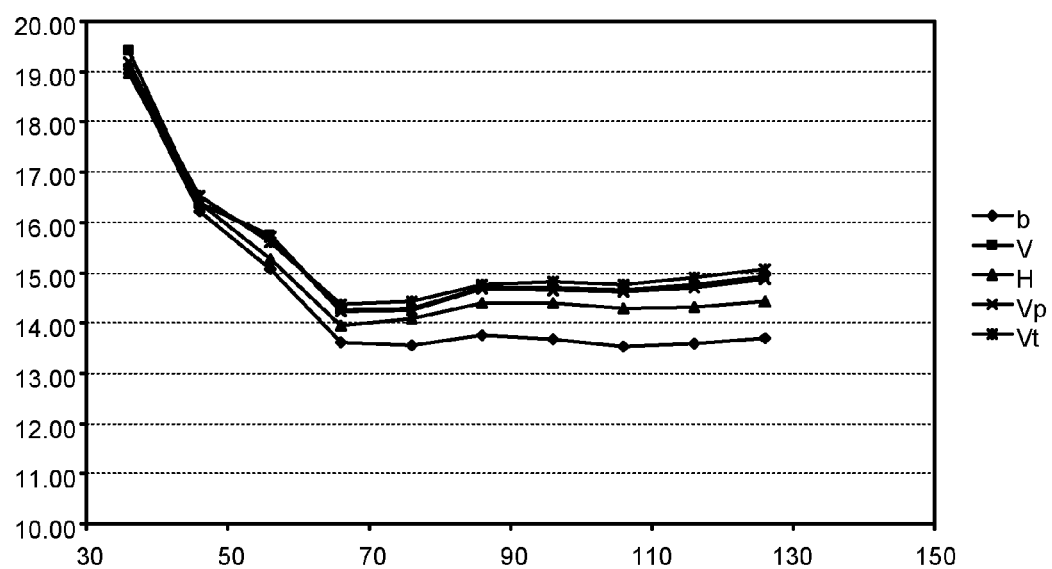
FIG. 14 is a graph of horizontal and vertical line:space ratios with pitch achieved with the illumination modes of FIGS. 12 and 13.

FIG. 12 shows another base illumination mode, an off-axis quadrupole mode. In this mode the intensity distribution in the pupil plane has four bright poles located symmetrically around the optical axis of the illumination system on the 45 degree lines between the X and Y axes. In an example of the method of the invention, this is modified as shown approximately in FIG. 13 by setting an number of facets to the "off" position. The number of facets is limited to less than 10% of the number set "on" to effect the illumination mode of FIG. 12 and the pixels are selected to match a target vertical line space ratio as a function of pitch. This is shown in FIG. 14 as the line connecting asterisks and labeled Vt. The line space ratio for the base illumination mode of FIG. 12 is shown as the line connecting diamonds in FIG. 14 and labeled b. It will be seen that the actually achieved vertical line space ratio (squares, V) and predicted vertical line space ratios (crosses, Vp) are virtually indistinguishable from the target. In this example, the horizontal line space ratio H (triangles) now differs from the vertical line space ratio but this was permitted by the optimization. An alternative optimization might prioritize minimizing HV offset over matching the target.

Figure 15:
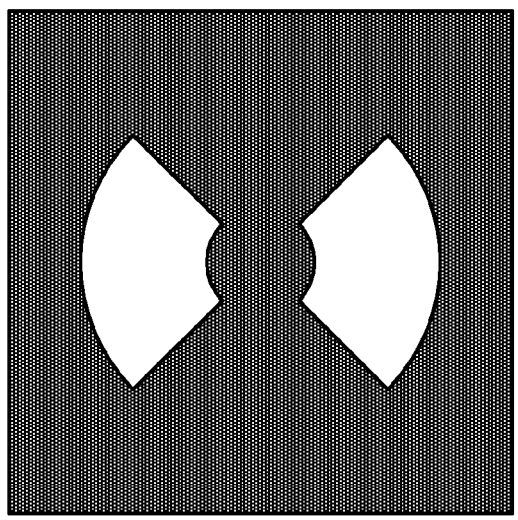
FIGS. 15 and 16 depict examples of different illumination modes used in another embodiment of the invention.
Figure 16:
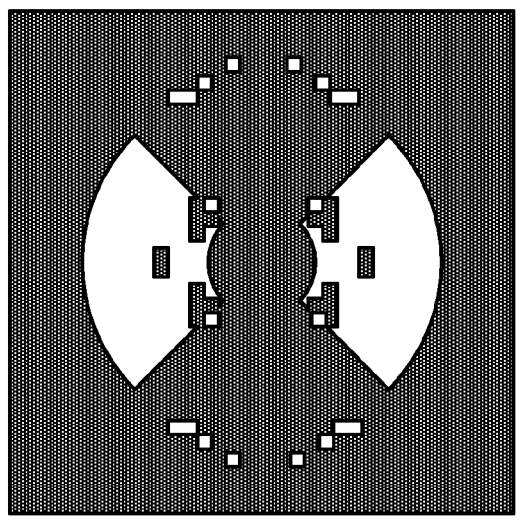
Figure 17:
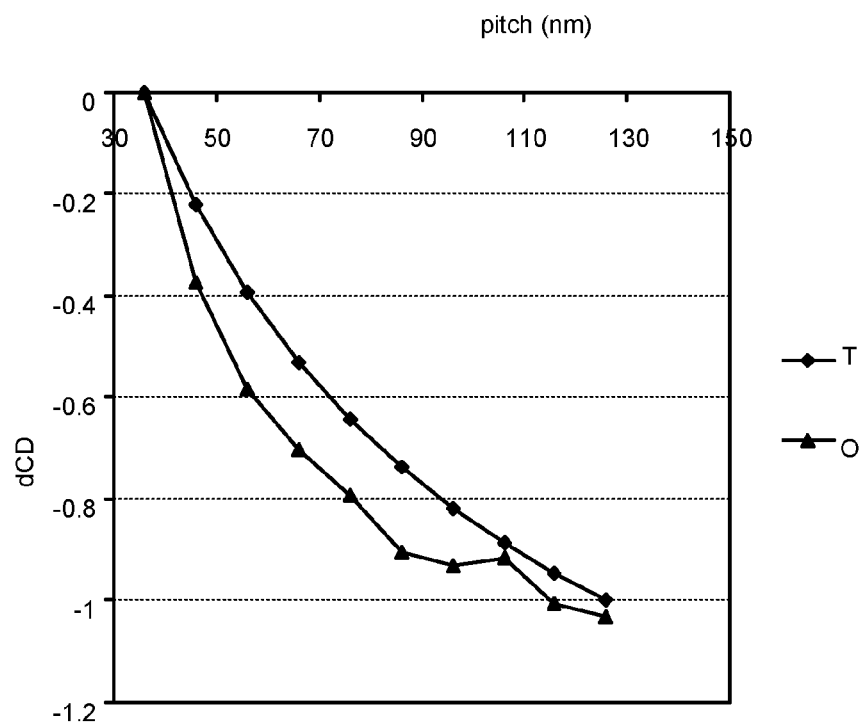
FIG. 17 is a graph of change in CD with pitch using the illumination mode of FIG. 16 compared to using the illumination mode of FIG. 15.

A still further example of the present invention is now described in relation to FIGS. 15 to 17. In this example, the base illumination mode is a dipole mode, with each pole being a 90 degree arc of an annular illumination mode centered on the X axis. This mode is modified, as shown approximately in FIG. 16, by switching certain of the facets that contribute to the dipole to their alternate "on" positions. Thus, each facet that is switched creates a dark region within the bright dipole of the base illumination mode as well as a bright region in the otherwise dark areas outside the dipole illumination mode. As can be seen in FIG. 17, this arrangement allows for close matching of a desired dCD vs pitch curve (diamonds) as shown by the curve obtained using the illumination mode of FIG. 16 (triangles).

Figure 18:
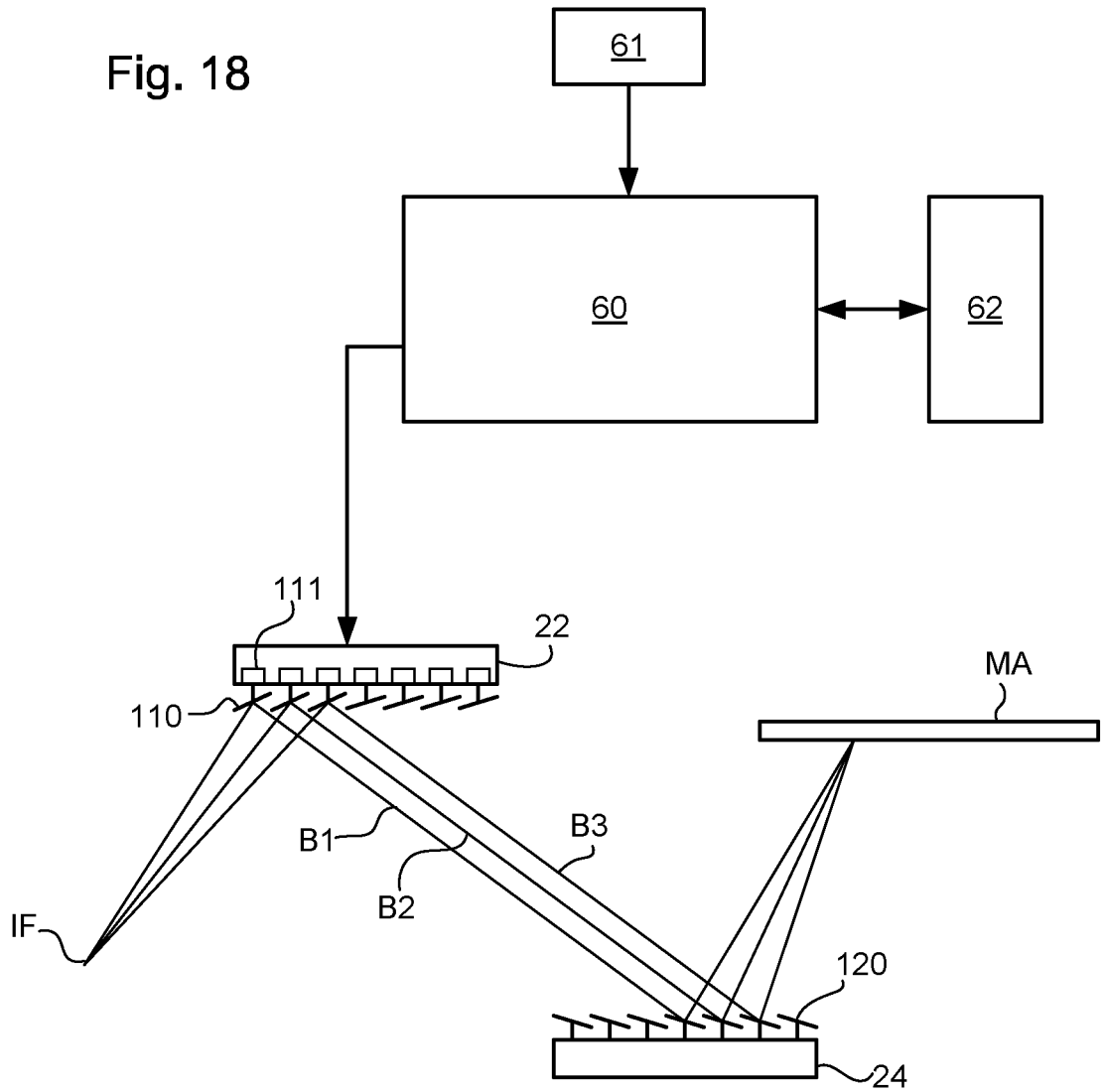
FIG. 18 depicts a control system for a field mirror including movable facets according to an embodiment of the invention.

A control system arranged to implement an embodiment of the present invention is shown in FIG. 18. Controller 60 receives information defining a base illumination mode and an optimization or matching target from interface 61. Interface 61 may be a user interface by which a user inputs the required information or an interface to a supervisory machine control system which coordinates activities of the apparatus as a whole and/or other associated devices in a lithocell or cluster. Interface 61 may also include a memory in which the information defining the base illumination mode and the optimization or matching target is stored. Based on the information, the controller 60 instructs actuators 111 to set the field facet mirrors to the necessary positions to effect an appropriate illumination mode. In doing so, controller 60 has reference to memory 62 which stores information identifying for each field facet mirror the effect of individually switching it away from the position required for the base illumination mode, to an "off" position or an attentive "on" position. Controller 60 uses this information to determine whether or not any other field facet mirrors need to be set to corrective positions on the basis of the optimization or matching target and the principles set out above.

Figure 19:
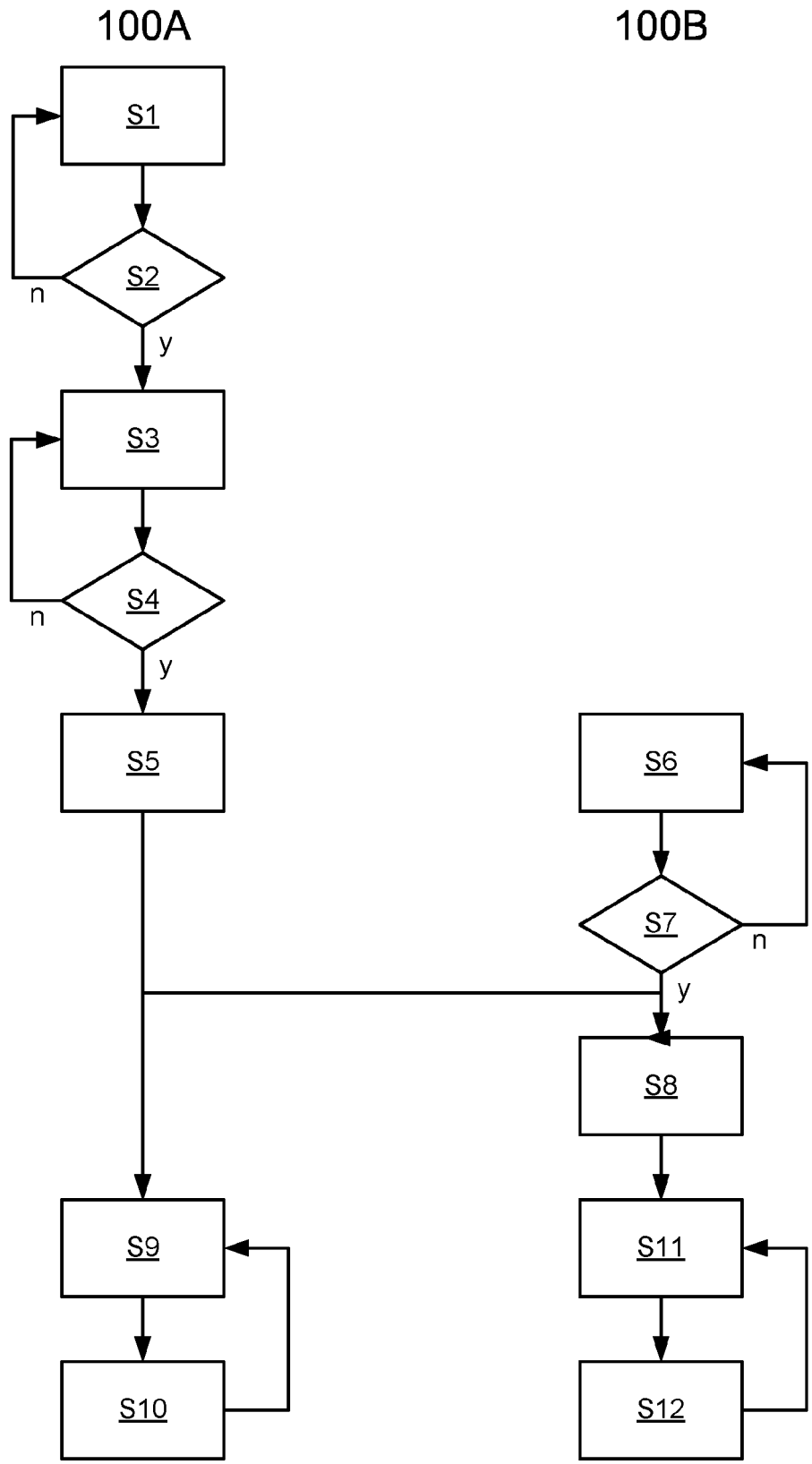
FIG. 19 is a flow chart of a method for matching two lithographic apparatuses according to a method of the invention.

As mentioned above, the present invention is particularly useful for matching different lithographic apparatus. Where substrates are to be exposed to a given pattern according to a given recipe on several different lithographic apparatus, it is often desirable that the results produce by the different apparatus are consistent. Thus, one apparatus is designated the reference apparatus. Once the recipe, that is values for all of the relevant adjustable parameters of the lithographic apparatus, has been optimized on the reference machine, the settings are used as a starting point for other machines but then adjusted to provide consistent performance. This process is shown in more detail in FIG. 19. FIG. 19 shows steps in two columns. The steps in the column labeled 100A are performed on the reference apparatus. The steps in the column labeled 100B are performed on the apparatus that is to be matched to the reference apparatus. These steps may be performed on any number of other apparatus, and are desirably performed on all other apparatus that are to be used to print the given recipe.

In step S1, a basic recipe for the process is established. The basic recipe may include details of the reticles, optical proximity correction applied to the reticles, process steps to be performed before and after the exposure and choice of a basic illumination mode. In step S2, the performance of the basic recipe is determined. This may be done by simulation or by actual printing of test substrates. If the results are not satisfactory, the parameters of the basic recipe are determined afresh. In step S2, parameters that are to be further optimized, for example proximity effects electricity and/or telecentricity, are measured. The next step, S3, is to determine adjustments to the base illumination mode, by switching to other positions certain field facets, that will improve the imaging parameter of interest, e.g. CD variation with pitch. In step S4, the effects of these adjustments are determined, again either by simulation or actual printing of test substrates. If the results are satisfactory, the method proceeds, otherwise further adjustments can be made. In step S5, a final characterization of the performance of the reference apparatus 100A is performed to provide a standard to match to.

Meanwhile, the basic recipe is applied S6 and verified S7 on the lithographic apparatus 100B that is to be matched to the reference lithographic apparatus 100A. Where a plurality of lithographic apparatus are to be matched to the reference apparatus 100A, these steps can be carried out in parallel on the different lithographic apparatus. Once an appropriate level of performance has been established on the lithographic apparatus 100B, the base illumination mode is modified as described above so as to match the performance of the reference apparatus in the relevant imaging parameter. It is to be noted that due to slight variations in the characteristics of the reference apparatus and the apparatus to be matched, the adjustments to the basic illumination mode that are applied in the lithographic apparatus 100B may differ from those applied in the reference apparatus.

Once the matching parameters have been determined, production of substrates can begin in both the reference apparatus S9 and the matched apparatus 100B S11. As is normal, the production exposures will be monitored S10, S12 and further adjustments to relevant imaging parameters may be made as required.

For this matching process, the initial inputs are the key system parameters, in particular illumination setting and apodization profile. It is also necessary to specify for the matching process, a figure of merit and a weight factor to be applied. A further limit on the matching process is the transmission to be achieved. This in effect limits the number of facets that can be set to "off" positions. In an embodiment, a transmission limit of 90%, 80%, 75%, 60% or 50% may be set. To perform the matching, it is necessary to calculate the resulting values of the imaging parameter of interest obtained from the base illumination mode, the base illumination mode with each field facet set "off" respectively and the base illumination mode with each facet searched to an alternative "on" position respectively. These values may however be determined in advance through simulation and may be applicable to both the reference apparatus and any other apparatus to be matched. Given these values, an appropriate solution to effect the desired optimization can be performed using conventional techniques.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, certain features of the invention may be embodied as a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. An illumination system for a lithographic apparatus arranged to project a pattern from a patterning device onto a substrate, the illumination system configured to condition a radiation beam and direct the radiation beam onto the patterning device, the illumination system comprising:

a first reflective component and a second reflective component, the first reflective component being arranged to direct radiation of the radiation beam onto the second reflective component, the first reflective component comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions in order to effect a desired illumination mode selected from a set of predetermined illumination modes and further arranged to set at least one of the moveable reflective elements to a corrective position, different than its desired position, to effect a correction of a proximity effect in the pattern.

2. An illumination system according to claim 1, wherein the control system is arranged to effect a correction of a proximity effect in the pattern, the proximity effect selected from the group consisting of: CD variation with pitch, NILS variation with pitch, and variation of line:space ratio with pitch.

3. An illumination system according to claim 1, wherein the control system is arranged to set the at least one of the movable elements to a position such that the at least one of the movable elements directs radiation in a direction so that the radiation does not reach the substrate.

4. An illumination system according to claim 1, wherein the control system is arranged to set the at least one of the movable elements to a position such that the at least one of the movable elements directs radiation in a direction so that the radiation does reach the substrate.

5. An illumination system according to claim 1, wherein the control system is arranged to set the at least one of the movable reflective elements so that a dark spot is formed in a bright region of the desired illumination mode.

6. An illumination system according to claim 1, wherein the control system is arranged to set the at least one of the movable reflective elements so that a bright spot is formed in a dark region of the desired illumination mode.

7. An illumination system according to claim 1, wherein the control system comprises:

a memory arranged to store information identifying the effect on the imaging parameter of each of the movable reflective elements in each position so the control system can adopt a selector for selecting one or of the movable reflective elements and a position thereof such that the sum of the effects of the selected movable reflective elements in the selected positions is as close as possible to a desired correction of a proximity effect in the pattern; and a selector arranged to select one or more of the movable reflective elements and a position thereof such that the sum of the effects of setting the selected movable reflective elements to the selected positions is as close as possible to a desired correction of a proximity effect in the pattern, wherein the control system is arranged to set the selected movable reflective elements to the selected positions.

8. An illumination system according to claim 7, wherein:

the movable reflective elements are arranged to direct radiation to positions on the second reflective component that have at least one degree of symmetry;

the memory is arranged to store information of the movable reflective elements on a substrate; and the control system further comprises a calculator arranged to calculate the effect of movable reflective elements for which information is not stored on the basis of the information that is stored and the degree of symmetry.

9. An illumination system according to claim 1, wherein the control system is arranged to select the predetermined illumination mode from a group consisting of: conventional illumination, dipole illumination, quadrupole illumination, soft quadrupole illumination, and annular illumination.

10. An illumination system according to claim 1, wherein the control system is arranged to set less than 20% of the movable reflective elements to corrective positions.

11. An illumination system according to claim 10, wherein the control system is arranged to set less than 10% of the movable reflective elements to corrective positions.

12. A lithographic method for manufacturing a device, the method comprising:
   directing a radiation beam onto a first reflective component so that it is reflected thereby and incident on a second reflective component, the radiation beam being incident thereafter on a patterning device, and first reflective component comprising a plurality of movable reflective elements, each movable reflective element being moveable between at least a first position and a second position so as to change an illumination mode of the patterning device;
   patterning the radiation beam using the patterning device;
   projecting the patterned radiation beam onto a substrate;
   setting the movable reflective elements to desired positions to define a desired illumination mode selected from a set of predetermined illumination modes; and
   setting at least one of the moveable reflective elements to a corrective position, different than its desired position, to effect a correction of a proximity effect in the pattern.

13. A lithographic method according to claim 12, wherein the at least one of the movable reflective elements is set to a corrective position to effect a correction of a proximity effect in the pattern, the proximity effect selected from the group consisting of: CD variation with pitch, NILs variation with pitch, and variation of line: space ratio with pitch.

14. A lithographic method according to claim 12, wherein the at least one of the movable reflective elements is set to a position such that the at least one of the movable reflective elements directs radiation in a direction so that the radiation does not reach the substrate.

15. A lithographic method according to claim 12, wherein the at least one of the movable reflective elements is set to a position such that the at least one of the movable reflective elements directs radiation in a direction so that the radiation does reach the substrate.

16. A lithographic method according to claim 12, wherein at least one of the movable reflective elements is set so that a bright spot is formed in a dark region of the desired illumination mode.

17. A lithographic method according to claim 12, wherein the at least one of the movable reflective elements is set so that a dark spot is formed in a bright region of the desired illumination mode.

18. A lithographic method according to claim 12, further comprising:
   storing information identifying the effect on the imaging parameter of each of the movable reflective elements in each position it can adopt;
   selecting one or of the movable reflective elements and a position thereof such that the sum of the effects of setting the selected movable reflective elements to the selected positions is as close as possible to a desired correction of a proximity effect in the pattern; and
   setting the selected movable reflective elements to the selected positions.

19. A lithographic method according to claim 18, wherein the movable reflective elements are arranged to direct radiation to positions on the second reflective component that have at least one degree of symmetry; and
   the storing comprises storing information on a substrate of the movable reflective elements; and
   calculating the effect of movable reflective elements for which information is not stored on the basis of the information that is stored and the degree of symmetry.

20. A lithographic method according to claim 12, wherein the predetermined illumination mode is selected from a group consisting of: conventional illumination, dipole illumination; quadrupole illumination, soft quadrupole illumination, and annular illumination.

21. A lithographic method according to claim 12, wherein the setting at least one of the movable reflective elements to a corrective position comprises setting less than about 20% of the movable reflective elements to corrective positions.

22. A lithographic method according to claim 21, wherein the setting at least one of the movable reflective elements to a corrective position comprises setting less than about 10% of the movable reflective elements to corrective positions.

23. A non-transitory computer readable medium comprising a computer readable memory storing instructions for controlling a lithographic apparatus arranged to project a pattern from a patterning device onto a substrate and having an illumination system configured to condition a radiation beam and direct the radiation beam onto the patterning device; wherein the illumination system comprises a first reflective component and a second reflective component, the first reflective component being arranged to direct radiation of the radiation beam onto the second reflective component and comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions, the instructions being effective to perform a method comprising:
   setting the movable reflective elements to desired positions to define a desired illumination mode selected from a set of predetermined illumination modes; and
   setting at least one of the moveable reflective elements to a corrective position, different than its desired position, to effect a correction of a proximity effect in the pattern.

24. A method of matching a plurality of lithography apparatus to manufacture devices according to a recipe, each lithographic apparatus arranged to project a pattern from a patterning device onto a substrate and having an illumination system configured to condition a radiation beam and direct the radiation beam onto the patterning device; wherein the illumination system comprise: a first reflective component and a second reflective component, the first reflective component being arranged to direct radiation of the radiation beam onto the second reflective component and comprising a plurality of movable reflective elements, each movable reflective element being moveable between at least a first position and a second position so as to change an illumination mode, and the second reflective component being associated with a pupil plane of the patterning device; and a control system arranged to set the plurality of moveable reflective elements to respective desired positions, the method comprising:

optimizing illumination settings on a first one of the lithographic apparatus by selecting a base illumination mode from a set of predetermined illumination modes and selecting at least one of the movable reflective elements of the first lithographic apparatus to set to a corrective position to effect a correction of a proximity effect in the pattern; and determining illumination settings for a second one of the lithographic apparatus so that its imaging performance matches the first one of the lithographic apparatus by selecting at least one of the movable reflective elements of the second lithographic apparatus to set to a corrective position different than a position effective to contribute to the base illumination mode.

25. A lithographic apparatus, comprising:

an illumination system configured to condition a radiation beam, the illumination system comprising a first reflective component and a second reflective component, the first reflective component being arranged to direct radiation of the radiation beam onto the second reflective component, the first reflective component comprising a plurality of movable reflective elements, each movable reflective element being moveable between at least a first position and a second position so as to change an illumination mode, and the second reflective component being associated with a pupil plane of the patterning device, and a control system arranged to set the plurality of moveable reflective elements to respective desired positions in order to effect a desired illumination mode selected from a set of predetermined illumination modes and further arranged to set at least one of the moveable reflective elements to a corrective position, different than its desired position, to effect a correction of a proximity effect in the pattern;

a support configured to support a patterning device, the patterning device being configured to receive the conditioned radiation beam from the illumination system and pattern the conditioned radiation beam to form a patterned radiation beam; and a projection system configured to project the patterned radiation beam onto a substrate.

* * * * *